US006373404B1

(12) United States Patent
Chou

(10) Patent No.: US 6,373,404 B1
(45) Date of Patent: Apr. 16, 2002

(54) ENCODING SENSOR SWITCH

(76) Inventor: Chin-Wen Chou, 7 Fl., No.233, Wu-Hsing Street, Hsin-I Dist., Taipei (TW)

(*) Notice: Subject to any disclaimer, the term of this patent is extended or adjusted under 35 U.S.C. 154(b) by 0 days.

(21) Appl. No.: 09/425,238

(22) Filed: Oct. 25, 1999

(51) Int. Cl.[7] ........................ H03K 17/94; H03M 11/00

(52) U.S. Cl. ............................ 341/20; 341/22; 345/163

(58) Field of Search ..................... 341/20, 22; 345/163, 345/165, 166, 157

(56) References Cited

U.S. PATENT DOCUMENTS 5,384,460 A * 1/1995 Tseng ......................... 345/166
5,602,569 A * 2/1997 Kato .......................... 345/158
5,748,181 A * 5/1998 Fu et al. ..................... 345/165
5,808,568 A * 9/1998 Wu ............................ 341/20

* cited by examiner

*Primary Examiner*—Timothy Edwards
(74) *Attorney, Agent, or Firm*—Bacon & Thomas

(57) ABSTRACT

An improved encoding sensor switch comprises an operatable unit having a driving shaft disposed in its pivot hole; an encoding socket; a sensor socket having its pivot portion penetrated the encoding socket and jointed with the driving shaft; a plurality of sensing contact pieces disposed on a concentric circle centered in the driving shaft; and a sensor element arranged on the sensor socket at a position corresponding with an arbitrary sensing contact piece. When operating, the driving shaft of the operatable unit will drive the sensing socket to move circularly, so that the sensor element will contact the sensing contact pieces one after another in rotation mode for output a train of predetermined encoded sensing signals.

7 Claims, 7 Drawing Sheets

ENCODING SENSOR SWITCH

BACKGROUND OF THE INVENTION

1. Field of the Invention

This invention relates to an improved encoding sensor switch in simple construction, easy assembly, and low production cost with distinct output signals.

2. Description of the Prior Art

A conventional encoding sensor switch applied in a mouse or a notebook computer shown in FIG. 1 comprises an operatable unit with a pivotally disposed driving shaft, wherein an encoding socket having predetermined signal-output pins and a plurality of sensing contact pieces disposed on a driving shaft centered concentric circle is rotatably mounted on one end of the driving shaft; the encoding socket is extended to form an adapter for adapting a sensor socket fixedly jointing with the driving shaft; three contact pieces made of a metallic material are bent to form contact tips and arranged on the sensor socket at positions corresponding with the sensing contact pieces; and a fixing piece and a frame are disposed on the sensing pieces for enhancing connection of the encoding socket and the sensor socket. When the driving shaft drives the interacted sensor socket, the contact pieces will touch the sensing contact pieces in a rotation mode to create discrete function signal out of the signal-output pins.

The defects of abovesaid conventional structure may be summarized as the following:

1. Complicated components result in high production cost, including considerable molding expenditure and assembly labor charge; and because of the tough assembly job, some hardware imperfections, such as bend of the signal-output pins, contact deflection, etc, will affect the yield and quality of the product.
2. As the contact pieces are made of a metallic material, and the contact tips thereof contact the sensing contact pieces in frictional manner that will inevitably cause non-uniform friction to create unequal consumption of the contact pieces and the sensing contact pieces, hence, ambiguity of output signal or failure of signal generation are frequently incurred in the lifetime shortened conventional encoding sensor switch.
3. In considering the contact manner with the contact pieces, the shape of the sensing contact pieces can scarcely be changed. Besides, as the wavebands produced by the contact pieces are different from each other, the spacing interval of the sensing contact pieces must be controlled very accurately that would require more cost to decrease rejections. And moreover, because the wavebands are different and the contact sections of the sensing contact pieces are too short plus intrinsic problems of point-contact, ambiguity of output signal, failure of signal generation, and signal-reading error are frequently incurred owing to delay of signal generation.

SUMMARY OF THE INVENTION

For eliminating abovesaid defects, this invention is proposed to provide an improved encoding sensor switch with distinct output signals in simple structure, easy assembling process, and lower cost, comprising: an operatable unit having a driving shaft disposed in its pivot hole; an encoding socket; a sensor socket having its pivot portion penetrated the encoding socket and jointed with the driving shaft; a plurality of sensing contact pieces disposed on a concentric circle centered in the driving shaft; and a sensor element arranged on the sensor socket at a position corresponding with an arbitrary sensing contact piece. When operating, the driving shaft of the operatable unit will drive the sensing socket to move circularly, so that the sensor element will contact the sensing contact pieces one after another in rotation mode for output a train of predetermined encoded sensing signals.

The primary object of this invention is to provide a low cost, easy combinable encoding sensor switch.

Another object of this invention is to provide an encoding socket that can be a printed or glued circuit board, or wired, or directly inserted in a signal-processing circuit board for output of distinct signals.

A further object of this invention is to provide a structure, wherein each sensing contact piece is radially or obliquely oriented to the driving shaft, or is offered with a signal-identifying section and a zigzag arranged signal-input section for prolonging sensing duration to create distinct signals.

BRIEF DESCRIPTION OF THE DRAWINGS

For a better understanding to the present invention, together with further advantages or features thereof, at least one preferred embodiment will be elucidated below with reference to the annexed drawings in which.

DETAILED DESCRIPTION OF THE PREFERRED EMBODIMENT

Figure 1:
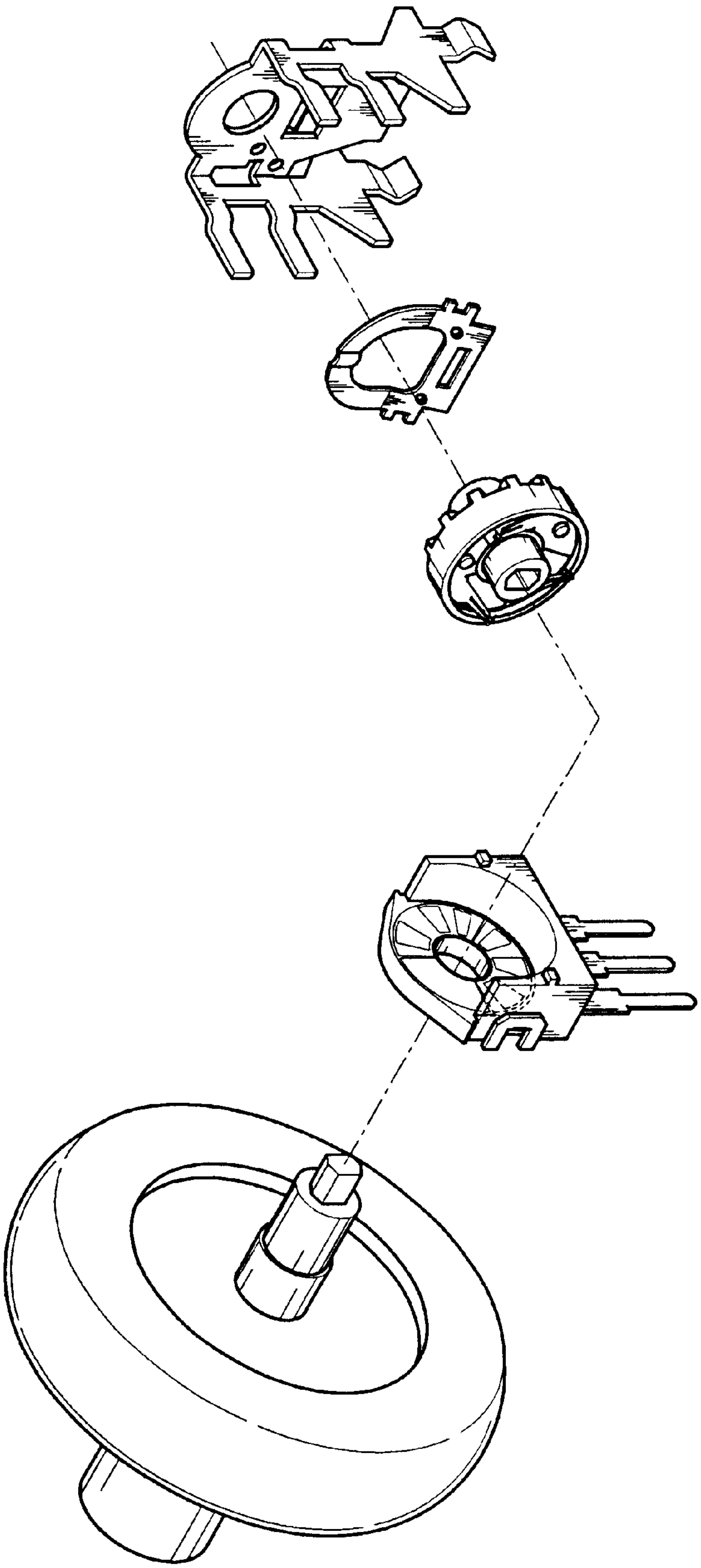
Fig. 1 PRIOR ART
FIG. 1 is an exploded schematic view of a prior structure.
Figure 2:
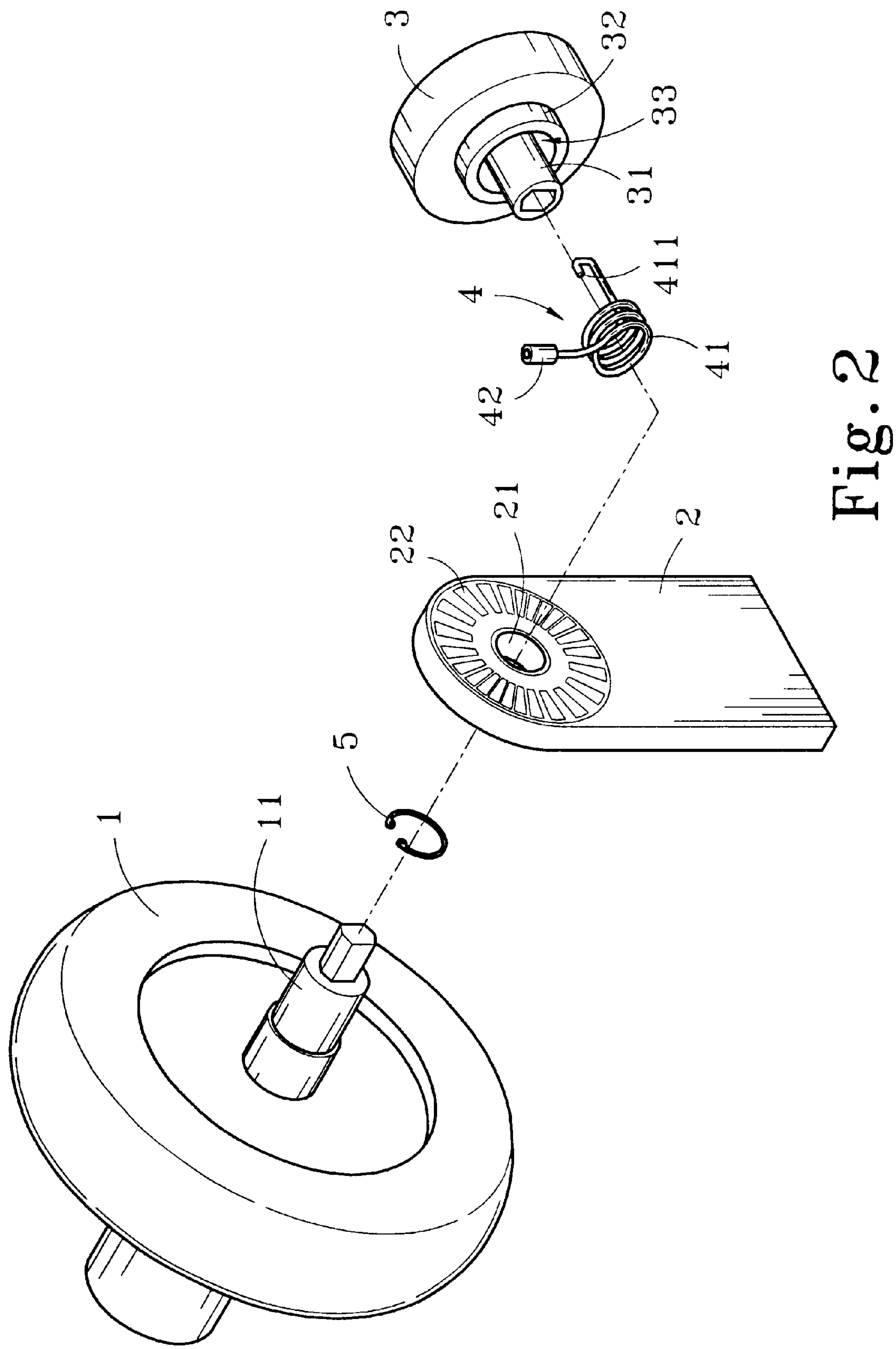
FIG. 2 is an exploded schematic view of this invention.
Figure 4:
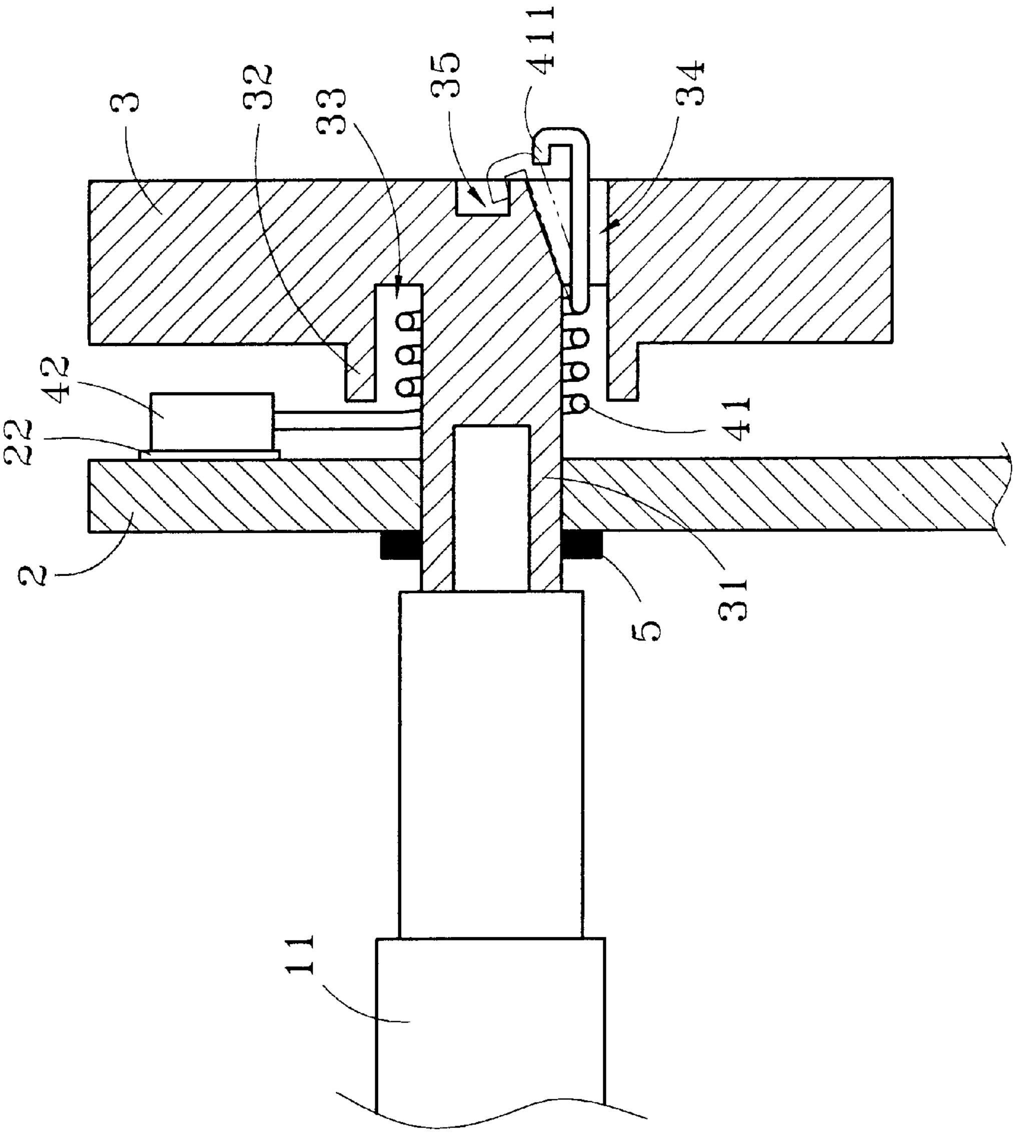
FIG. 4 is a vertical sectional view of this invention after assembled.

Referring to FIG. 2 and 4, this invention contains an operatable unit 1, which can be a rolling wheel to be disposed in a mouse or attached to a notebook computer, with a driving shaft 11. An encoding socket 2 and a sensor socket 3 with a fixedly jointing portion 31 penetrating the former are collared on one end of the driving shaft 11, and a positioning article 5 serving as an adjuvant for jointing the sensor socket 3 and the encoding socket 2 is disposed on the jointing portion 31 at the end penetrating the encoding socket 2. Moreover, a plurality of sensing contact pieces 22 is located in a concentric circle centered in the driving shaft 11, and a sensor element 4 is jointedly disposed on the sensor socket 3 at positions corresponding with the sensing contact pieces 22. In virtue of above architecture, the driving shaft 11 of the operatable unit 1 will interact and drive the sensor socket 3 to move in circular motion thereby the sensor element 4 will press and contact the sensing contact pieces 22 to create a train of predetermined output sensing codes to thus form an encoding sensor switch of this invention with distinct output signals by an easy assembly process in a relatively lower production cost.

An annular groove 33 is defined locating between the jointing portion 31 and a protruded portion 32 in the sensor socket 3, wherein a through hole 34 is perforated in the annular groove 33, and a predetermined recess 35 is formed in the outer face of the sensor socket 3 adjacent to the through hole 34. The sensor element 4 contains an elastic compressible article 41 in form of a helical spring collared on the jointing portion 31 and stowed in the annular groove 33 with its two ends extended respectively in a predetermined angle, wherein one end of the compressible article 41 is extended to lay on top of the jointing portion 31 and pivotally mounted with a rolling element 42 made of a conductive material while the other end is bent to form a fastening part 411 for penetrating the through hole 34 to get retained in the recess 35 in order to anchor the compressible article 41 at the sensor socket 3.

Figure 5:
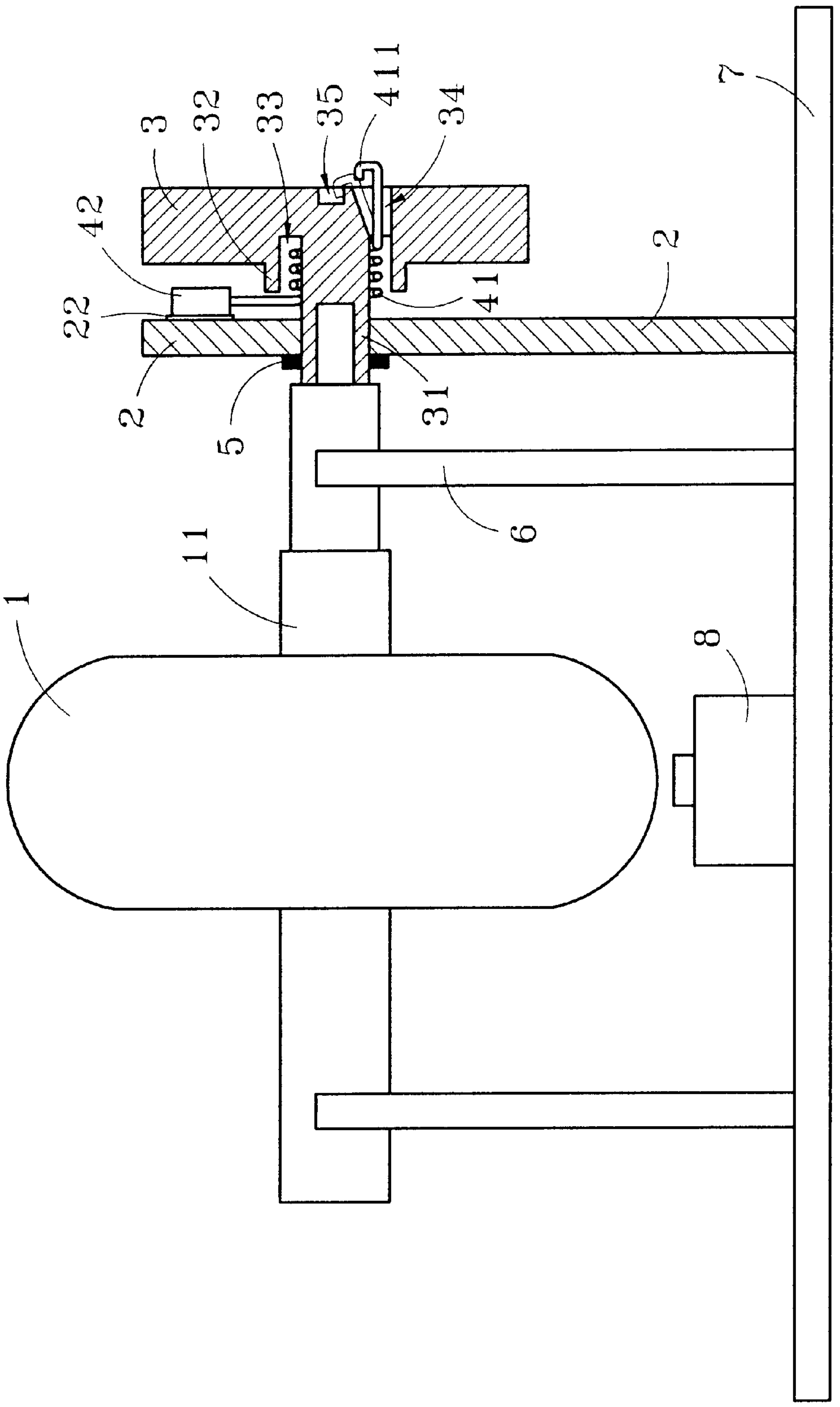
FIG. 5 is a schematic view showing an embodiment of this invention.

As shown in FIG. 2 and 5, when assembling this invention, the procedure is to firstly position the driving shaft 11 on a baseboard or a signal-processing circuit board 7 of a mouse (or a notebook computer) by using support posts 6; dispose an instruction-output switch 8 within operation scope of the operatable unit 1 and collar a pivot hole 21 of the encoding socket 2 onto one end of the driving shaft 11 in case the encoding socket 2 is printed with circuit or attached with a printed circuit board that the encoding socket 2 may be wired previously, or it may be inserted in the signal-processing circuit board 7 directly for positioning; let the jointing portion 31 together with the sensor element 4 assembled thereon penetrate the pivot hole 21 and joint with the driving shaft 11 in a manner that the compressible article 41 is slightly compressed to enable the rolling element 42 to exert proper pressure on one of the sensing contact pieces 22; and joint the auxiliary positioning article 5 with the sensor socket 3 and the encoding sensor socket 2 to complete assembly of this invention.

Figure 3:
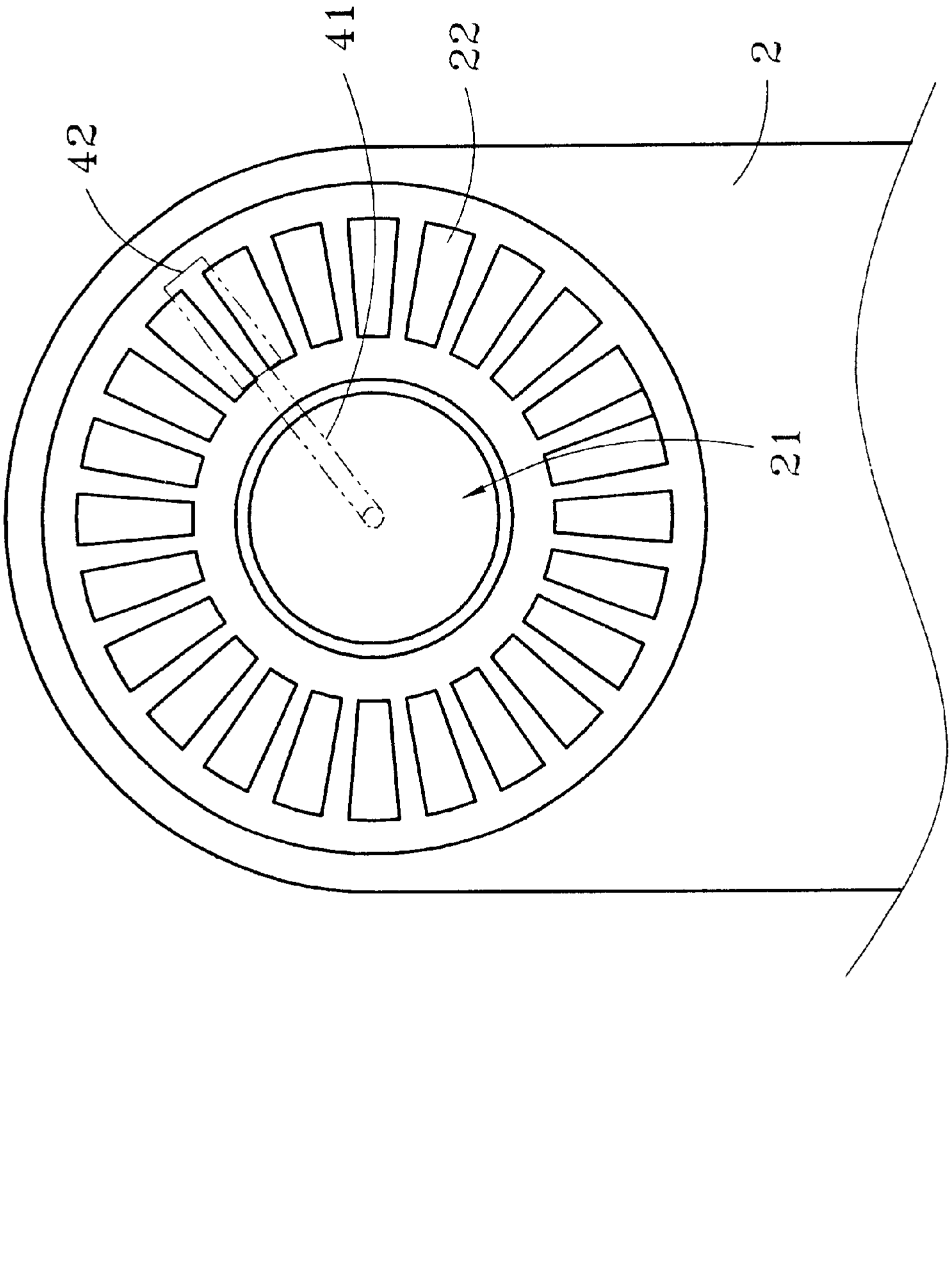
FIG. 3 is a front view of a encoding socket of this invention.
Figure 6:
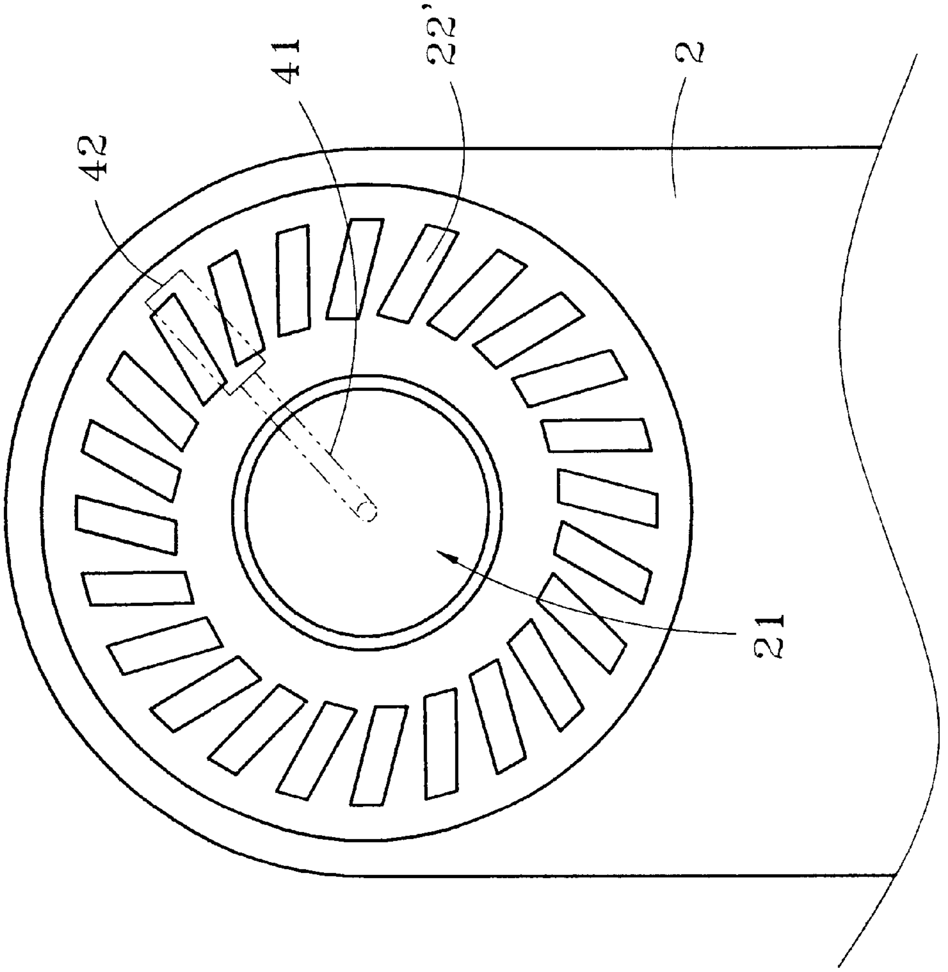
FIG. 6 is a schematic view showing another embodiment of this invention.

Please refer to FIG. 3 and 6. When the operatable unit 1 is pressed to rotate, the driving shaft 11 will interact with the sensor socket 3 and force the latter to perform circular motion that enables the rolling element 42 to press against the sensing contact pieces 22 and create discrete function signal in rotation mode to reach the signal-processing circuit board 7 for transmission of a train of output signals. (As the encoding module is already known, it will no longer be elucidated repeatedly here.)

Figure 7:
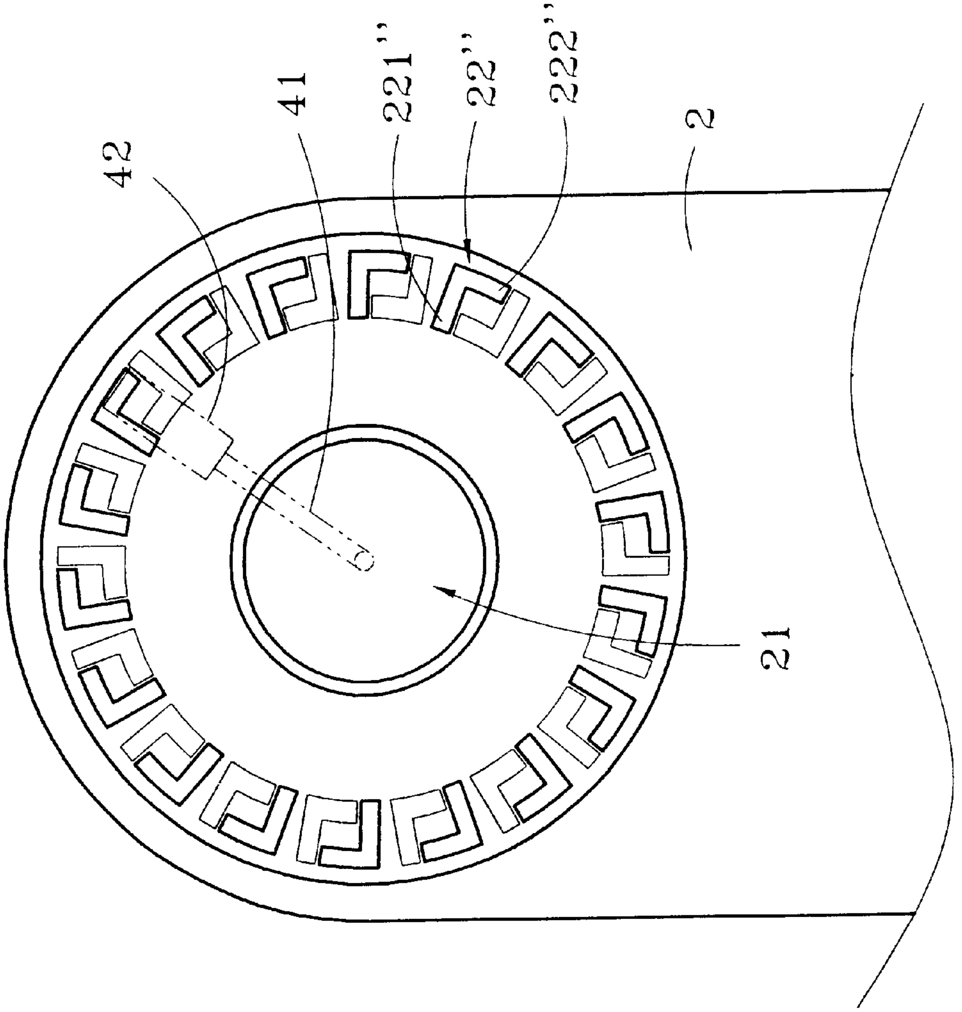
FIG. 7 is a schematic view showing yet another embodiment of this invention.

Whereas the contact area of the rolling element 42 to the sensing contact pieces 22 is objectively sufficient, any signal ambiguity, creation failure, or reading error can be remarkably eliminated, and also the friction between the rolling element 42 and the sensing contact pieces 22 can be substantially reduced for prolonging lifetime of this invention. Moreover, as shown in FIG. 3 and 6, the shape of the sensing contact piece 22 may be diversified to meet requirements different in sensing duration, such as the sensing contact piece 22, 22' pointing a direction coincident with or oblique to that of the driving shaft 11; or, as the sensing contact piece 22" in FIG. 7 having a signal-identifying section 221" and a staggeringly arranged signal-input section 222" for prolonging sensing duration of the sensor element 4 to the sensing contact piece 22.

Although, this invention has been described in terms of preferred embodiments, it is apparent that numerous variations and modifications may be made without departing from the true spirit and scope thereof, as set forth in the following claims.

What is claimed is:

1. An improved encoding sensor switch, comprising:

an operatable unit having a driving shaft disposed pivotally:

an encoding socket fixed jointed with one end of said driving shaft, wherein said encoding socket is provided with a plurality of sensing contact pieces located in a concentric circle centered in said driving shaft; and a sensing socket being penetrated pivotally by a fixed jointing portion, wherein a sensor element is disposed on said sensing socket at a position corresponding with an arbitrary sensing contact piece;

whereby by means of circular motion of said sensing element, driven by said driving shaft in said operable unit, said sensor element being capable of pressing and contacting said sensing contact pieces one after another, whereby a train of predetermined encoded sensed signals with distinct outputs are generated;

whereby the encoding sensor switch is of low cost, and easily assembled.

2. The improved encoding sensor switch of claim 1, wherein said operatable unit can be a rolling wheel applied in a mouse or a notebook computer.

3. The improved encoding sensor switch of claim 1, wherein an auxiliary positioning article is arranged locating at the end of said fix-jointing portion penetrating said encoding socket for enhancing connection of said encoding socket with said sensing socket.

4. The improved encoding sensor switch of claim 1, wherein said encoding socket can be a circuit board with printed or glued pattern.

5. The improved encoding sensor switch of claim 1, wherein said sensor element comprises an elastic compressible article in form of a helical spring collared on said fix-jointing portion with its two ends extended respectively in a predetermined included angle, and a rolling element pivotally mounted at one end of said elastic compressible article, wherein the other end of said elastic compressible article is bent to form a fastening part for penetrating said sensing socket to get retained in a recess in the outer face of said sensing socket.

6. The improved encoding sensor switch of claim 1, wherein said sensing contact piece is radially or obliquely oriented with respect to said driving shaft.

7. The improved encoding sensor switch of claim 1, wherein said sensing contact piece comprises a signal-identifying section and a staggeringly arranged signal-input section.

* * * * *